US007800403B2

(12) United States Patent
Marshall, Jr.

(10) Patent No.: US 7,800,403 B2
(45) Date of Patent: Sep. 21, 2010

(54) UNIVERSAL NON-VOLATILE SUPPORT DEVICE FOR SUPPORTING RECONFIGURABLE PROCESSING SYSTEMS

(75) Inventor: Joseph R. Marshall, Jr., Manassas, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 92 days.

(21) Appl. No.: 11/991,024

(22) PCT Filed: Jun. 6, 2007

(86) PCT No.: PCT/US2007/070477

§ 371 (c)(1), (2), (4) Date: Feb. 26, 2008

(87) PCT Pub. No.: WO2008/011232

PCT Pub. Date: Jan. 24, 2008

(65) Prior Publication Data

US 2009/0261857 A1 Oct. 22, 2009

Related U.S. Application Data

(60) Provisional application No. 60/811,612, filed on Jun. 7, 2006.

(51) Int. Cl.
*H03K 19/173* (2006.01)

(52) U.S. Cl. ........................................................ 326/38

(58) Field of Classification Search ............ 326/37–41, 326/47, 101
See application file for complete search history.

(56) References Cited

U.S. PATENT DOCUMENTS

| | | | |
|---|---|---|---|
| 6,781,409 B2 | 8/2004 | Turner | |
| 6,838,899 B2 | 1/2005 | Plants | |
| 6,952,114 B2 | 10/2005 | Turner | |
| 6,954,875 B2 | 10/2005 | Liu | |
| 6,965,521 B2 | 11/2005 | Li et al. | |
| 6,990,010 B1 | 1/2006 | Plants | |
| 2005/0027409 A1 | 2/2005 | Marshall et al. | |
| 2006/0001045 A1 | 1/2006 | Sidhu et al. | |
| 2007/0168718 A1 * | 7/2007 | Reblewski et al. | 714/15 |

* cited by examiner

*Primary Examiner*—Rexford N Barnie
*Assistant Examiner*—Thienvu V Tran
(74) *Attorney, Agent, or Firm*—Dillon & Yudell LLP; Antony Ng; Daniel J. Long

(57) ABSTRACT

A universal support device for supporting a reconfigurable electronics device is disclosed. The universal support device includes an application specific integrated circuit (ASIC) module coupled to multiple non-volatile memory devices. The ASIC module is capable of interfacing with an external reconfigurable electronics device via a set of load/read-back interface lines and sense mitigation lines. The load/read-back interface lines are capable of being programmed to provide a parallel or a serial load and/or store protocols. The sense mitigation line can sense conditions that indicate a single-event functional interrupt or a radiation-induced event occurred within the reconfigurable electronics device.

5 Claims, 4 Drawing Sheets

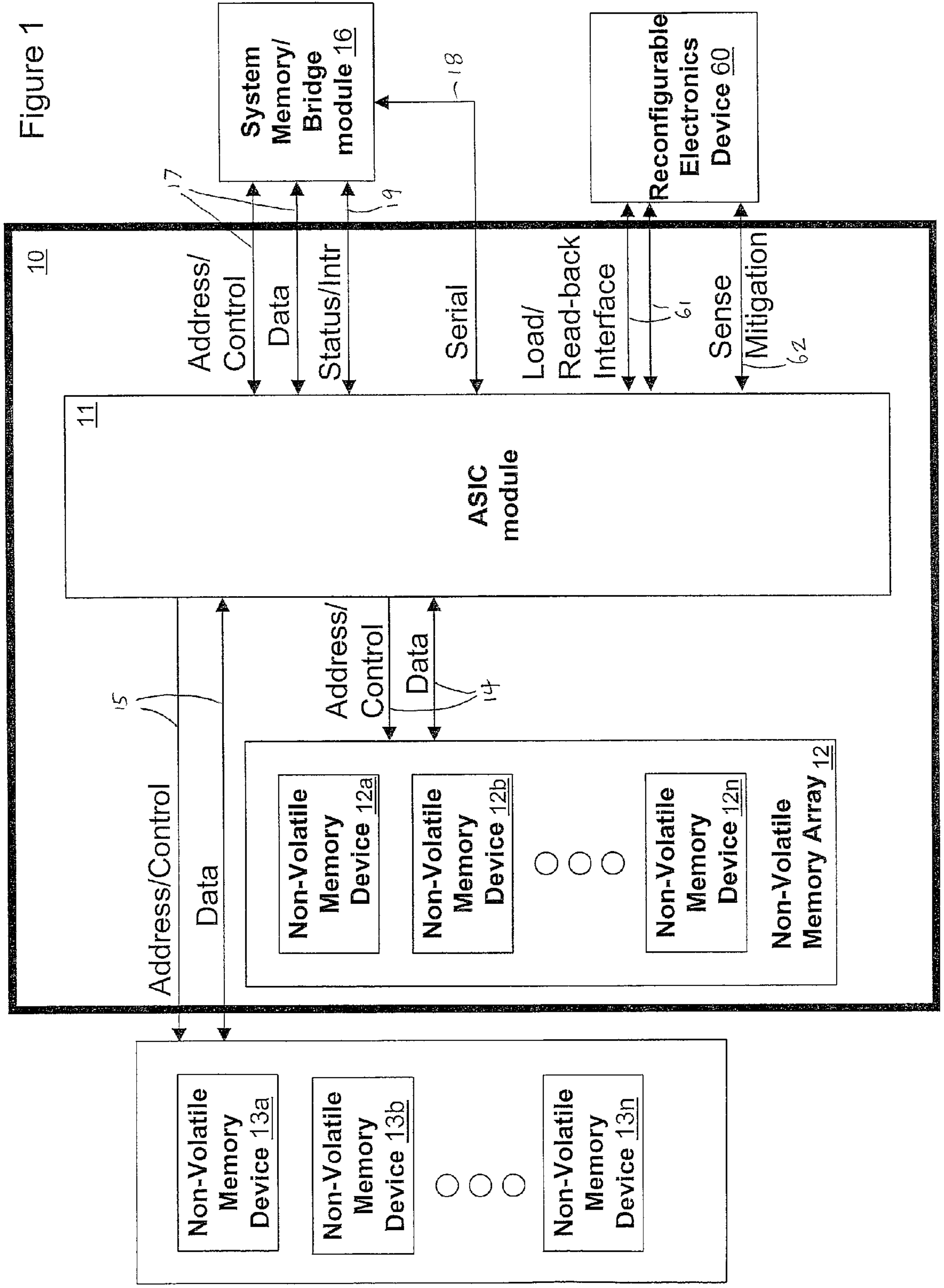

Figure 1
10
System Memory/ Bridge module 16
18
17
19
Reconfigurable Electronics Device 60
Address/ Control
Data
Status/Intr
Serial
Load/ Read-back Interface
61
Sense
Mitigation
62
11
ASIC module
Address/ Control
Data
14
15
Address/Control
Data
Non-Volatile Memory Device 12a
Non-Volatile Memory Device 12b
Non-Volatile Memory Device 12n
Non-Volatile Memory Array 12
Non-Volatile Memory Device 13a
Non-Volatile Memory Device 13b
Non-Volatile Memory Device 13n

UNIVERSAL NON-VOLATILE SUPPORT DEVICE FOR SUPPORTING RECONFIGURABLE PROCESSING SYSTEMS

CROSS REFERENCE TO RELATED APPLICATIONS

The present application claims benefit of priority to the previously filed U.S. Provisional Patent Application No. 60/811,612 entitled "Universal non-volatile support device for RAM based reconfigurable electronics," filed on Jun. 7, 2006, which is incorporated by reference herein.

STATEMENT OF GOVERNMENT INTEREST

The present invention was made with United States Government support under contract number FA9453-05-C-0222 awarded by the United States Air Force. The United States Government has certain rights in the present invention.

BACKGROUND OF THE INVENTION

1. Technical Field

The present invention relates to electronic devices in general, and in particular to field programmable gate arrays. Still more particularly, the present invention relates to a universal non-volatile support device for supporting reconfigurable processing systems.

2. Description of Related Art

Field programmable gate arrays (FPGAs) are commonly utilized to demonstrate or prove out a conceptual data processing system. Offering similar densities and performance as application specific integrated circuits (ASICs), FPGAs are typically a driver for the latest technology. There are two types of FPGAs, namely, fuse-based FPGAs and memory-based FPGAs. Fuse-based FPGAs can only be written once after which no change can be made to the logic. Memory-based FPGAs, on the other hand, have changeable logic but need to be reloaded each time. Thus, memory-based FPGAs are more suitable for implementing reconfigurable processing systems.

A reconfigurable processing system typically includes multiple reconfigurable FPGA building blocks that are capable of being morphed into any required processing capability after the reconfigurable processing system has been assembled. Thus, reconfigurable processing systems can play a major role in responsive spacecraft, fault-tolerant spacecraft and multi-mission spacecraft because the functionalities of reconfigurable processing systems can be easily modified for specific needs even after a spacecraft has been launched into space.

Reconfigurable processing systems are typically put together with off-the-shelf pre-defined components. As FPGAs become more widespread with improving capabilities, reconfigurable computing elements (RCEs) formed by FPGAs will soon be employed throughout reconfigurable processing systems, both as stand-alone elements and as embedded elements. Many of the RCEs share similar reconfigurable enabling technologies; however, rather than one RCE configuration fits all, there are specializations in each application area that best fit different types of RCEs.

The present disclosure provides a universal non-volatile support device for supporting random access memory-based reconfigurable processing systems and other types of reconfigurable electronics such as field programmable analog arrays.

SUMMARY OF THE INVENTION

In accordance with a preferred embodiment of the present invention, a universal support device for supporting a reconfigurable electronics device includes an application specific integrated circuit (ASIC) module coupled to multiple non-volatile memory devices. The ASIC module is capable of interfacing with an external reconfigurable electronics device via a set of load/read-back interface lines and sense mitigation lines. The load/read-back interface lines are capable of being programmed to provide a parallel or a serial load and/or store protocols. The sense mitigation lines can sense conditions that indicate a single-event functional interrupt or a radiation-induced event occurred within the reconfigurable electronics device.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 1 is a block diagram of a universal reconfigurable electronics support device (URESD), in accordance with a preferred embodiment of the present invention;

DETAILED DESCRIPTION OF A PREFERRED EMBODIMENT

Figure 2:
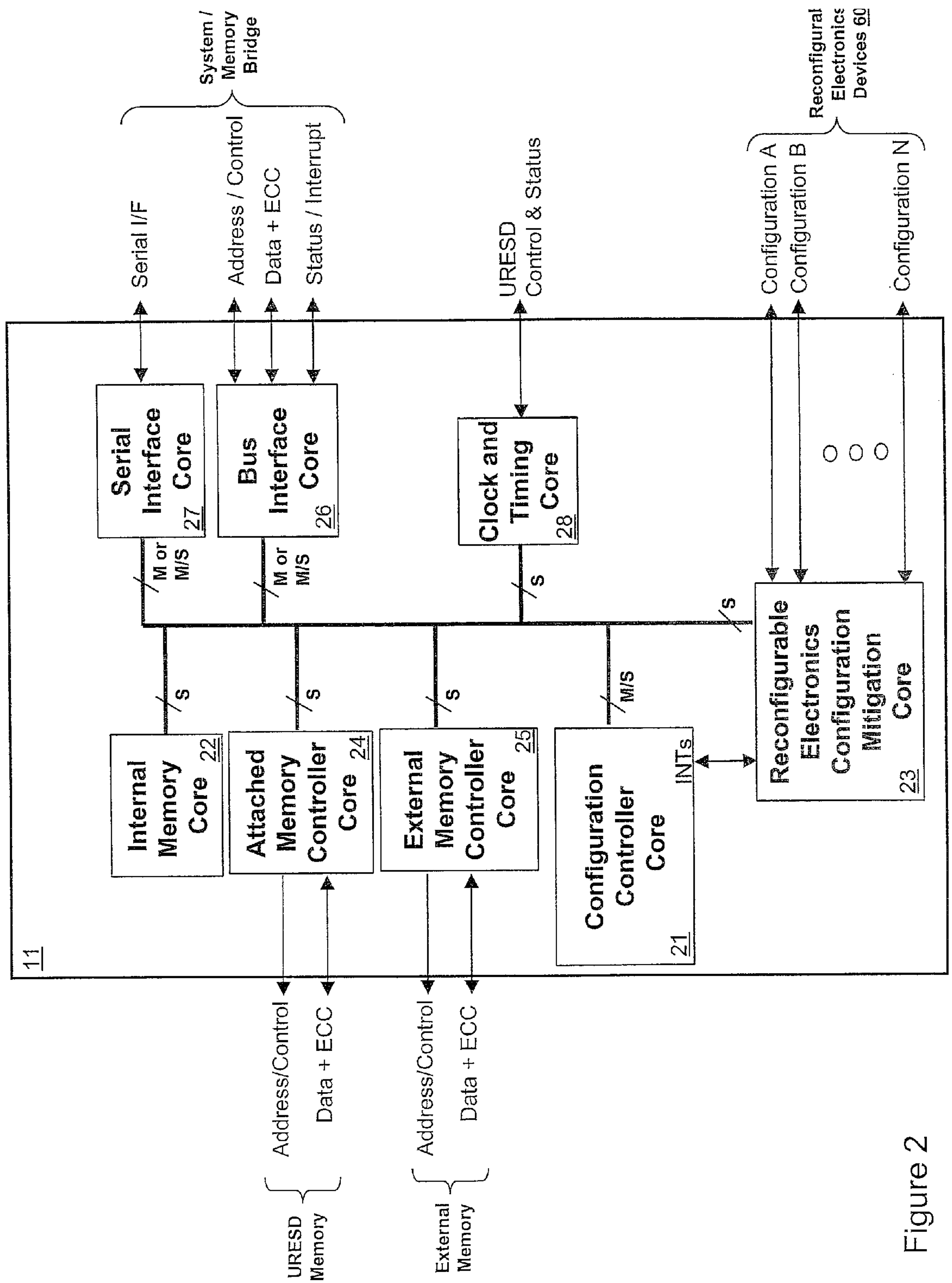
FIG. 2 is a block diagram of an application specific integrated circuit module within the URESD from FIG. 1, in accordance with a preferred embodiment of the present invention.

Referring now to the drawings and in particular to FIG. 1, there is depicted a block diagram of a universal reconfigurable electronics support device (URESD), in accordance with a preferred embodiment of the present invention. As shown, an URESD 10 includes an application specific integrated circuit (ASIC) module 11 and a non-volatile memory array 12 having non-volatile memory devices 12*a*-12*n*. An interface to non-volatile memory devices 12*a*-12*n* is performed via address/control and data lines 14. ASIC module 11 may be implemented in any field programmable electronics such as fused-based field programmable gate arrays (FPGAs).

URESD 10 is scalable and may provide an interface to additional non-volatile memory devices, such as non-volatile memory devices 13*a*-13*n*, if such non-volatile memory devices are needed for one or more configuration loads to support a specific level of reconfigurable electronics. An interface to non-volatile memory devices 13*a*-13*n* is performed via address/control and data lines 15. Additional address lines can be provided for future growth.

When URESD 10 is intended to be used in single-event upset (SEU) susceptible environment, such as space, then all components within URESD 10 need to be manufactured with radiation-hardened technologies. In addition, error-correcting codes (ECCs) may be used in redundant bits if SEUs are expected in non-volatile memory devices 12a-12n as well as non-volatile memory devices 13a-13n.

URESD 10 can be interfaced to a system memory/bridge module 16 via address/control and data lines 17 and/or a serial line 18 utilizing a serial protocol such as Joint Testing Application Group (JTAG). URESD 10 may initiate transfers to system memory/bridge module 16 using an interface such as peripheral component interface (PCI) (parallel) or SpaceWire (serial), or URESD 10 may operate as a slave to system memory/bridge module 16 only responding to operations. URESD 10 also has the ability to receive or to provide status and interrupts back to system memory/bridge module 16 via a status/interrupt line 19.

URESD 10 can be interfaced to a reconfigurable electronics device 60 via a set of load/read-back interface lines 61 that may be programmed to provide a variety of parallel or serial load or store protocols spanning the signal set. In addition, sense mitigation lines 62 may be used to sense conditions that indicate a signal-event functional interrupt (SEFI) or other radiation-induced event has occurred within reconfigurable electronics device 60. Load/read-back interface lines 61 along with sense mitigation lines 62 are used to load, read back configuration sense radiation-induced events, reset reconfigurable electronics device 60 and to fix any bits in error. URESD 10 may read its configuration information either from some subset of interface lines 61 and 17 and/or from its internal non-volatile memory array 12 to share/enable sets of pins, set and/or change their functions or pin widths.

With reference now to FIG. 2, there is depicted a detailed block diagram of ASIC module 11 from FIG. 1, in accordance with a preferred embodiment of the present invention. As shown, ASIC module 11 includes a configuration controller core 21, a configuration registers internal memory core 22, a reconfigurable electronics configuration mitigation core 23, an attached memory controller core 24, an external memory controller core 25, a bus interface core 26, a serial interface core 27, and a clock and timing core 28. Configuration controller core 21 is initially activated after power-up in order to make sure that all configuration registers in each core as well as internal memory core 22 are loaded with their default (non-volatile) values. External lines may be used to direct external memory controller core 25 to choose if more than one configuration memory exists. Such configurations are either loaded from an on-chip non-volatile memory within internal memory core 22 or from a small pre-defined section of URESD memory through attached memory controller core 24.

External memory controller core 25 may interface to one or more external system memory. Configuration registers within the various cores and internal memory core 22 indicate interface sizes and protocols, speed of interfaces, parallel or serial loading of reconfigurable electronics devices. They also indicate their width (if parallel), the size of blocks to check before correction, the amount and location of memory and operations to be performed upon power-up, the configuration image number, the sequencing registers, along with error detection and correction.

After ASIC module 11 has been configured, reconfigurable electronic device 60 (from FIG. 1) may be controlled automatically or on command from ASIC module 11. Configuration controller core 21 directs configuration mitigation core 23 to fetch a configuration from internal non-volatile memories (such as non-volatile memory array 12 from FIG. 1) and load the configuration into reconfigurable electronics device 60.

After the configuration has been loaded, configuration controller core 21 directs configuration mitigation core 23 to enable the function of the volatile reconfigurable electronics device and then begins reading back its configuration and checking the configuration with what is stored in internal or external memory either through direct comparisons of the data or through comparisons of codes covering the data. If a mismatch is found, configuration mitigation core 23 then sends an interrupt to an external processor through status/interrupt line 19 and to configuration controller core 21 to complete its current block check, and then configuration controller core 21 directs configuration mitigation core 23 to reload the block and recheck the configuration. Configuration mitigation core 23 can also be configured to stop, reload the block and then resume operation. If the configuration is good, configuration mitigation core 23 sends an all-good status signal to configuration controller mole 21 that in turn passes it to system memory/bridge module 16 (from FIG. 1). Status pins, memory or registers indicating the device or block being repaired will also be maintained for readout or polling.

Non-volatile attached memory controller core 24 and external memory controller cores 25 read or write non-volatile or volatile memory assets to URESD 10 or other external devices, as directed by the other controllers. External memory controller core 25 provides enough drive for low-latency access to external memories.

In a slave mode, bus interface core 26 and serial interface core 27 simply responds to read and write accesses from system memory/bridge module 16 and then directs the data in or out of the appropriate element in the support chip or non-volatile memory. In a master mode, bus interface core 26 and serial interface core 27 pass data back to system memory/bridge module 16 as directed by configuration controller core 21. Clock and timing core 28 manages all timing between various scores within URESD module 11 and responds to resets from ASIC module 11. The various cores are preferably interconnected via an on-chip bus that can be a shared bus structure or a cross-bar switch.

Figure 3:
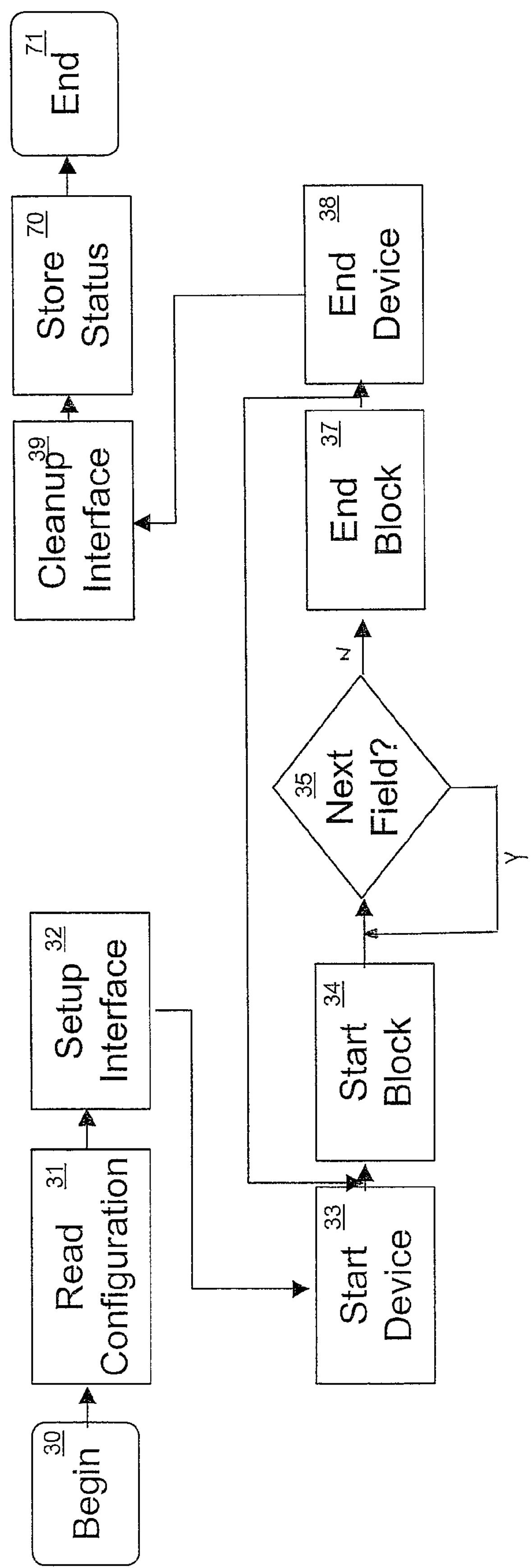
FIG. 3 is a high-level logic flow diagram of a method for performing a sequencing within the URESD from FIG. 1, in accordance with a preferred embodiment of the present invention.

Referring now to FIG. 3, there is illustrated a high-level logic flow diagram of a method for performing a sequencing within URESD 10, in accordance with a preferred embodiment of the present invention. Starting at block 30, the configuration for URESD 10 is read from a configuration memory, and a specific personalization is loaded, as shown in block 31. Once personalized, URESD 10 is not required to be loaded every time, although each personalization loading can eliminate any latent errors caused by SEUs. SEU errors may also be eliminated through the usage of ECCs implemented on personalization registers or flagged for reload by error detection codes or redundancy. Based on the loaded personalization, various interfaces within URESD 10 may be set up to match the type of reconfigurable electronics device to which URESD 10 is connected, such as reconfigurable electronics device 60 from FIG. 1, as depicted block 32. The setting up of various interfaces may include the change of number of bits, the frequency of transmission, handshake polarity or timing, etc.

Next, certain counters of the reconfigurable electronics device are initialized, as shown in block 33. Within the reconfigurable electronics device, data are preferably maintained in blocks, directories or packets, and counters are initialized for each block, as depicted in block 34. After a block has been initialized, the actual data to be loaded or compared can be sequenced according to sequencing registers based on each block definition. Each field type is processed as configured accordingly, as shown in block 35. Some examples of possible field types are shown in FIG. 4.

End block 37 is used to differentiate one block of processing from another. If end block 37 is the last block of processing for the reconfigurable electronics device, end device 38 is next sequenced; otherwise, the sequence jumps back to the start block 34. End device 38 cleans up the reconfigurable electronics device handling and if it is the last reconfigurable electronics device, cleanup interface is executed, as shown in block 39. Otherwise, the process can return to block 33 for a next reconfigurable electronics device. The status of such operation is stored, as shown in block 70, and the sequence is completed, as depicted in block 71. At such time, either another sequence may be started or URESD 10 may wait for a command from system memory/bridge module 16 (from FIG. 1).

Figure 4:
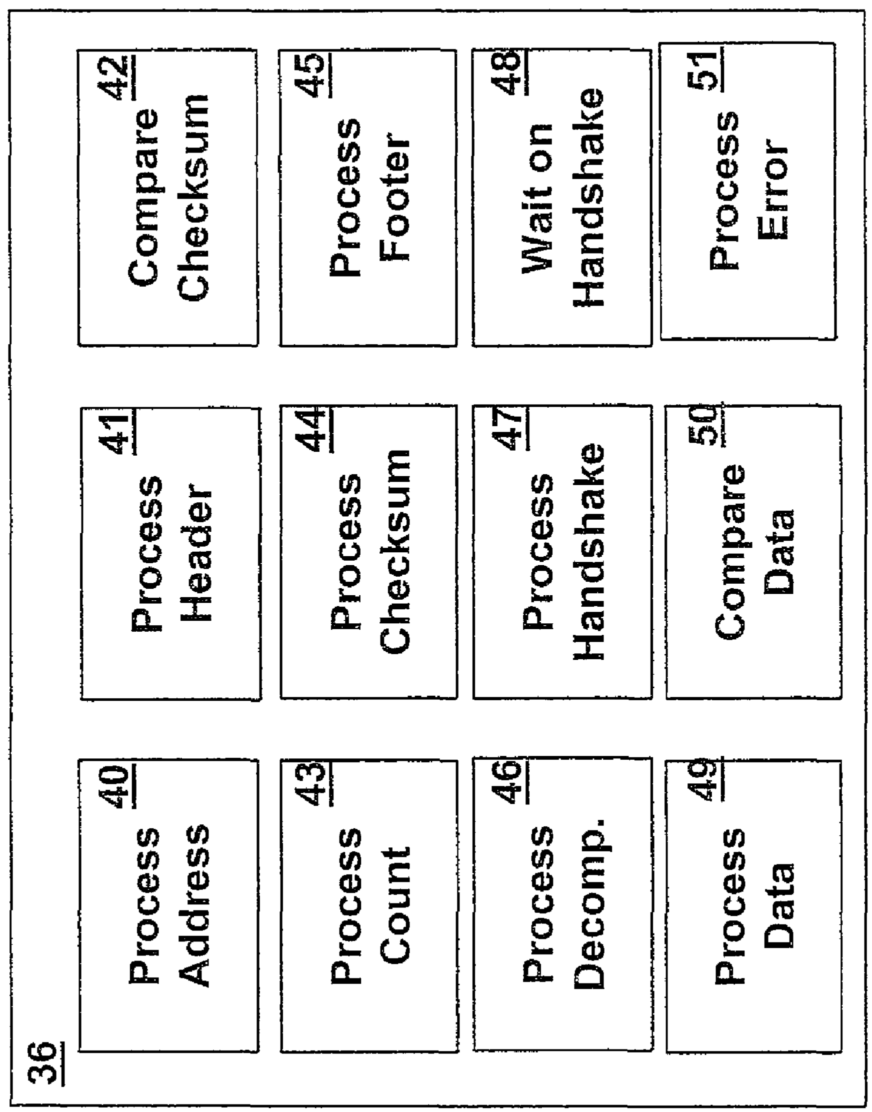
FIG. 4 is a block diagram of field types examples in a block within a reconfigurable electronics device, in accordance with a preferred embodiment of the present invention.

With reference now to FIG. 4, there is depicted a block diagram of field types examples in a block within a reconfigurable electronics device, in accordance with a preferred embodiment of the present invention. As shown, process Header 41 represents any fixed codes that need to be sent to a reconfigurable device. Process Address 40 sends any address fields to the reconfigurable device in the output stream and including shifting and serializing. Process Address 40 increments by some fixed value after the current address is sent. Process Data 49 fetches the next packet or block of data and send it to the reconfigurable device. Compare Data 50 reads a packet or block of data from the reconfigurable device and compares it to the value stored in configuration memory or it compares a checksum of each data element. Process Checksum 44 receives a checksum and compares it to the checksum stored in memory or to the last block or packet of data read from configuration memory. Process Footer 45 sends a fixed code to the reconfigurable device. Process Count 43 sends the current count of data to the reconfigurable device. Process Handshake 47 activates external handshake signals to the reconfigurable device for fixed periods or on a permanent basis. Wait on Handshake 48 waits on a change or level on an external signal from the reconfigurable device before continuing. Process Error 51 checks for an error and if one is found sets the appropriate registers and input/outputs to report an error and may also change certain count or sequence states to either restart a sequence or start another. Process Decomposition 46 is used to decompress a packet or block of data and send it to the reconfigurable device according to a compression algorithm.

As has been described, the present invention provides a universal support devices for supporting reconfigurable electronics devices. The support device of the present invention can be useful in any space system that uses reconfigurable electronics devices having an external configuration memory to provide savings in size, power and developmental costs and in part due to reuse and programming of a single developed devices instead of continual new instantiations and the combining of multiple functions into a single device. The support device of the present invention can also be used in commercial processing systems that require non-volatile memory in their reconfigurable electronics devices.

While the invention has been particularly shown and described with reference to a preferred embodiment, it will be understood by those skilled in the art that various changes in form and detail may be made therein without departing from the spirit and scope of the invention.

What is claimed is:

1. A universal support device for supporting an external reconfigurable electronics device, said support device comprising:

a plurality of non-volatile memory devices; and an application specific integrated circuit (ASIC) module coupled to said non-volatile memory devices, wherein said ASIC module is capable of interfacing with the external reconfigurable electronics device, wherein said ASIC module includes:

a set of load/read-back interface lines that are capable of being programmed to provide a parallel or a serial load and/or store protocols for interfacing with said external reconfigurable electronics device;

a set of sense mitigation lines for sensing conditions that indicate a single-event functional interrupt or a radiation-induced event occurred within said external reconfigurable electronics device a configuration controller core and a configuration mitigation core, wherein said configuration controller core directs said configuration mitigation core to fetch a configuration from said non-volatile memory devices and to load said configuration into said external reconfigurable electronics device.

2. The support device of claim 1, wherein said load/read-back interface lines along with said sense mitigation lines are used to load, read back configuration sense radiation-induced events, reset said external reconfigurable electronics device and to fix any bits in error.

3. The support device of claim 1, wherein said ASIC module includes a memory controller core for interfacing with said non-volatile memory devices.

4. The support device of claim 1, wherein said ASIC module is made of fuse-based field programmable gate arrays (FPGAs).

5. The support device of claim 1, wherein said ASIC module is adaptable to interface with different external reconfigurable electronics devices without physical changes to internal circuits.

* * * * *